United States Patent
Stenfort

(10) Patent No.: US 6,879,272 B1
(45) Date of Patent: Apr. 12, 2005

(54) METHOD AND APPARATUS FOR CONTROLLING DATA OUTPUT FREQUENCY

(75) Inventor: Ross Stenfort, San Jose, CA (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 10/786,867

(22) Filed: Feb. 24, 2004

(51) Int. Cl.[7] .............................................. H03M 7/04
(52) U.S. Cl. ........................................ 341/94; 326/41
(58) Field of Search .................. 341/94, 52; 326/37–41

(56) References Cited

U.S. PATENT DOCUMENTS

| | | | | |
|---|---|---|---|---|
| 5,313,637 A | * | 5/1994 | Rose | 713/200 |
| 5,854,794 A | * | 12/1998 | Pawlowski | 370/509 |
| 5,883,883 A | * | 3/1999 | Baker et al. | 370/250 |
| 5,959,932 A | * | 9/1999 | MacLellan et al. | 365/230.05 |
| 6,161,206 A | * | 12/2000 | Wasson | 714/738 |
| 6,246,681 B1 | * | 6/2001 | Humphrey et al. | 370/389 |
| 6,363,078 B1 | * | 3/2002 | Garcia et al. | 370/438 |
| 6,690,193 B1 | * | 2/2004 | Heinzer et al. | 326/37 |

\* cited by examiner

*Primary Examiner*—Michael Tokar
*Assistant Examiner*—Linh V Nguyen
(74) *Attorney, Agent, or Firm*—Martine Penilla & Gencarella, LLP

(57) ABSTRACT

Broadly speaking, a method and corresponding apparatus is provided for controlling a data output rate of an electronic device. More specifically, the method and corresponding apparatus enables an equivalent data output rate to be obtained from each of an ASIC and an FPGA prototype of the ASIC while maintaining equivalent logic between the ASIC and the FPGA prototype. A validity bit is attached to each output data signal in accordance with each cycle of a clock signal. The validity bit provides an indication as to whether the associated data signal should be processed (i.e., transmitted as output) normally. Only valid output data signals as identified by their validity bit value are transmitted. Thus, the validity bit values associated with successive data signals can be defined to generate a particular data output rate.

20 Claims, 3 Drawing Sheets

METHOD AND APPARATUS FOR CONTROLLING DATA OUTPUT FREQUENCY

BACKGROUND OF THE INVENTION

1. Field of the Invention

The present invention relates generally electronic circuit design, and more specifically to controlling an output data rate of an electronic circuit.

2. Description of the Related Art

An application specific integrated circuit (ASIC) is a chip, or portion thereof, that is custom designed for a specific application, as opposed to a general-purpose chip such as a microprocessor. Since the ASIC is designed for a specific application, the ASIC can be optimally configured to provide improved performance of the specific application as compared to the general-purpose chip. In other words, since the general-purpose chip requires overhead that is not necessary for the specific application, the general-purpose chip is less optimized (i.e., slower) for the specific application as compared to the ASIC. Fully customized ASIC chips use a custom-designed mask for each layer in the chip, thus design and fabrication of ASIC chips can be quite time consuming and costly. Therefore, it is beneficial in the ASIC design process to develop a prototype of the ASIC for testing prior to fabrication of the actual ASIC.

One method for developing the prototype of the ASIC involves the use of a field programmable gate array (FPGA). The FPGA is a type of gate array that can be programmed outside of a semiconductor fabrication operation (i.e., in the field). The FPGA is an integrated circuit containing a number of logic cells that can each be independently programmed to perform one of a number of functions. The number of logic cells are interconnected by a network of wires and programmable switches. The number of logic cells and associated interconnects can be programmed to define basic circuitry building blocks that can then be combined to create a complex circuit. Thus, the FPGA can be programmed to represent a prototype of an ASIC.

Once the FPGA prototype of the ASIC is developed, testing is performed using the FPGA prototype to evaluate the functionality and performance of the ASIC design. Thus, the FPGA prototype testing can be used to identify and correct problems that may be present in the ASIC design prior to investment of substantial time and money in fabricating the ASIC. In order to ensure applicability of FPGA prototype test results to the ultimate ASIC design, it is desirable to have the same logic in the FPGA prototype as that intended to be put in the ASIC. Also, in order to simulate the actual operating conditions of the ASIC using the FPGA prototype, it is desirable to have the same data output rate from both the FPGA prototype and the ASIC. However, due to fundamental differences between the FPGA and the ASIC, conventional methods for using the FPGA prototype to test the ASIC design have not been able to simultaneously maintain the same logic and the same data output rate between both the ASIC and the FPGA prototype.

More specifically, since the programmable gate arrays of the FPGA prototype operate slower that the "hard-wired" ASIC circuitry, the FPGA prototype is required to operate at a slower clock speed relative to the ASIC. Consequently, the data output rate of the FPGA prototype is slower than the data output rate of the ASIC. Since the clock speed of the FPGA prototype cannot be increased sufficiently to match the ASIC data output rate, conventional methods have included modifying the FPGA prototype logic to achieve a data output rate that more closely matches the ASIC data output rate. However, as previously mentioned, introducing differences between the logic of the FPGA prototype and the logic of the ASIC increases a probability that the FPGA prototype performance will not be truly representative of the ASIC design. Also, each time a different ASIC data output rate is to be simulated by the FPGA prototype, the FPGA prototype logic has to be re-modified.

In view of the foregoing, a method and an apparatus is needed for maintaining equivalent logic between an ASIC and a corresponding FPGA prototype while achieving an equivalent data output rate from each of the ASIC and the FPGA prototype.

SUMMARY OF THE INVENTION

Broadly speaking, the present invention provides a method and corresponding apparatus for controlling a data output rate of an electronic device. More specifically, the method and corresponding apparatus of the present invention enables an equivalent data output rate to be obtained from each of an ASIC and an FPGA prototype of the ASIC while maintaining equivalent logic between the ASIC and the FPGA prototype. The present invention attaches a validity bit to each output data signal in accordance with each cycle of a clock signal, wherein the clock signal can be different between the ASIC and the FPGA prototype. The validity bit provides an indication as to whether the associated data signal should be processed normally as a valid data signal or discarded as an invalid data signal. Upon receipt of the data signal and associated validity bit at a transceiver, the data signal is processed according to a value of the validity bit. Thus, only valid output data signals are transmitted by the transceiver. In this manner, the validity bit values associated with successive data signals can be defined to generate a particular data output rate.

In one embodiment, a method for controlling a data output frequency is disclosed. The method includes defining a validity bit within a set of bits representing output data. The validity bit indicates a status of the output data. The method also includes defining a validity bit value pattern associated with a particular data output frequency. Successive validity bit values of the validity bit pattern are assigned to the validity bit in accordance with each cycle of a clock signal. The method further includes transmitting the set of bits representing the output data in accordance with each cycle of the clock signal and processing the output data according to the validity bit.

In another embodiment, a method for testing circuitry is disclosed. The method includes providing a field programmable gate array (FPGA) and an application specific integrated circuit (ASIC), wherein the FPGA and ASIC have substantially similar logic. The method also includes defining an FPGA validity bit pattern and an ASIC validity bit pattern, wherein both the FPGA validity bit pattern and the ASIC validity bit pattern are associated with a common data output frequency. The method further includes operating the FPGA and the ASIC in accordance with their respective validity bit pattern to generate test results.

In another embodiment, a data output frequency control module is disclosed. The data output frequency control module includes a data rate control module configured to output a validity bit signal in accordance with a clock signal to be generated by a clock circuit. The data output frequency control module also includes a logic stage configured to receive a data signal and the validity bit signal. A transceiver is connected to receive the data signal and the validity bit signal from the logic stage. The transceiver is further configured to recognize a valid state of the validity bit signal and process the data signal in response to the valid state.

Other aspects of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION

Broadly speaking, the present invention provides a method and corresponding apparatus for controlling a data output rate of an electronic device. More specifically, the method and corresponding apparatus of the present invention enables an equivalent data output rate to be obtained from each of an ASIC and an FPGA prototype of the ASIC while maintaining equivalent logic between the ASIC and the FPGA prototype. The present invention attaches a validity bit to each output data signal in accordance with each cycle of a clock signal, wherein the clock signal can be different between the ASIC and the FPGA prototype. The validity bit provides an indication as to whether the associated data signal should be processed normally as a valid data signal or discarded as an invalid data signal. Upon receipt of the data signal and associated validity bit at a transceiver, the data signal is processed according to a value of the validity bit. Thus, only valid output data signals are transmitted by the transceiver. In this manner, the validity bit values associated with successive data signals can be defined to generate a particular data output rate.

It should be appreciated that the present invention can be implemented in numerous ways, including as a process, an apparatus, a system, a device, or a method. Several exemplary embodiments of the invention will now be described in detail with reference to the accompanying drawings.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
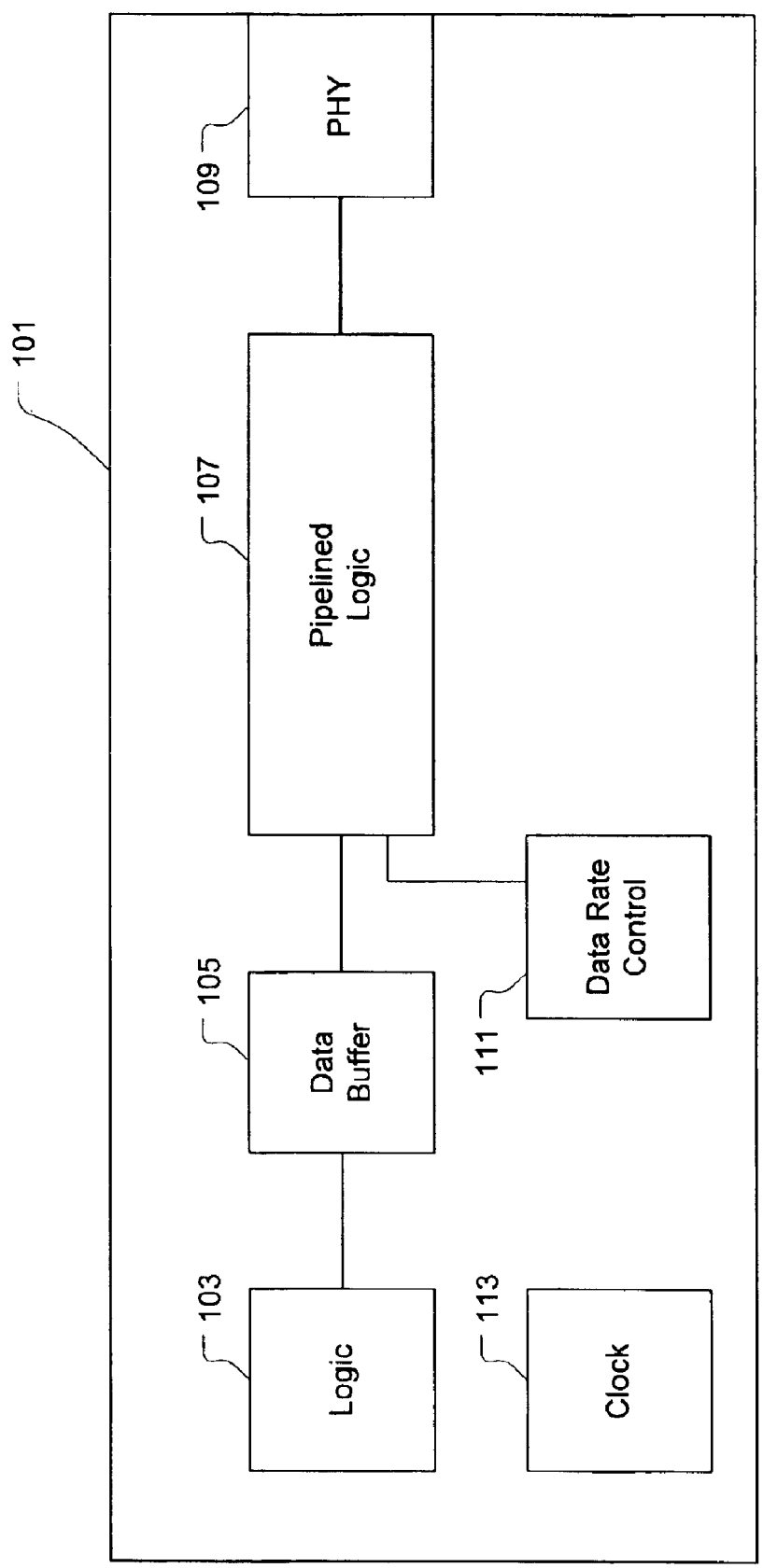
FIG. 1 is an illustration showing a block diagram of a device implementing data output rate control, in accordance with one embodiment of the present invention.

FIG. 1 is an illustration showing a block diagram of a device 101 implementing data output rate control, in accordance with one embodiment of the present invention. In various embodiments, the device 101 can represent an ASIC, an FPGA prototype of an ASIC, or a portion thereof. The device 101 includes logic 103 configured to perform one or more functions associated with the device 101. The logic 103 is connected to operate in accordance with a clock signal received from a clock circuit 1113. In the embodiment of FIG. 1, the logic 103 is capable of generating data to be transmitted to a data buffer 105. It should be appreciated that the data buffer 105 can be any type of data buffer 105 known to those skilled in the art. For example, in one embodiment, the data buffer 105 is defined as first-in-first-out (FIFO) type of data buffer 105.

The device 101 also includes a data output segment including a data rate control 111, pipelined logic 107, and a phy 109. It should be appreciated that the device 101 can be defined to have multiple data output segments. The pipelined logic 107 is connected to receive a data signal from the data buffer 105 in accordance with the clock signal received from the clock circuit 113. The data signal received by the pipeline logic 107 from the data buffer 105 represents output data to be ultimately transmitted to the phy 109. It should be appreciated that the data signal can be composed of a number of bits. For example, in various embodiments, the data signal can be composed of 8 bits, 16 bits, 32 bits, 64 bits, etc. Regardless of the data signal composition (i.e., number of bits), the data signal is transmitted as a single unit.

The pipelined logic 107 is defined to perform various processes on the output data in preparation for transmission of the output data to the phy 109. The pipelined logic 107 is defined as a series of sequentially connected logic stages through which the output data is transmitted. Thus, the output data entering the pipelined logic 107 from the data buffer 105 is transmitted from one logic stage to the next until ultimately exiting the pipelined logic 107 in transmission to the phy 109. Each logic stage of the pipelined logic 107 can be defined to perform a specific function associated with preparing the output data for transmission to the phy 109. For example, in one embodiment, the device 101 corresponds to a device for implementing a communication protocol. In this embodiment, the pipelined logic 107 includes logic stages respectively defined to generate header data, encode the output data, and generate cyclic redundancy check (CRC) data. It should be appreciated, however, that in other embodiments the pipelined logic 107 can be defined to include any combination of logic stages, wherein each logic stage is defined to perform essentially any function associated with preparing the output data for transmission to the phy 109. The pipelined logic 107 configuration lends itself to more efficient and equivalent implementation in both the ASIC and the FPGA prototype of the ASIC. Thus, the pipelined logic 107 effectively standardizes the output data path from the data buffer 105 to the phy 109 in both the ASIC and the FPGA prototype.

The phy 109 represents a device 101 object that is used to interface with another device. In one embodiment, the phy 109 is defined as a transceiver capable of electrically interfacing with a physical link that is connected to a phy of another device. The phy 109 includes a transmitter portion for sending the output data and a receiver portion for receiving input data (i.e., output data from another phy).

In the embodiment of FIG. 1, the output data is transmitted from the data buffer 105, through the successive logic stages of the pipelined logic 107, and to the phy 109, in accordance with each cycle of the clock signal generated by the clock circuit 113. Thus, a rate at which data is transmitted from the pipelined logic 107 to the phy 109 is defined by the clock signal. In one embodiment, the clock signal is generated by the clock circuit 113 with a substantially constant frequency. Thus, data is transmitted from the pipelined logic 107 to the phy 109 at the same substantially constant frequency.

The device 101, however, includes a data rate control module 111 for controlling a rate at which true (i.e., valid) output data is transmitted to the phy 109 without adjusting the clock signal frequency or the pipelined logic 107. The data rate control module 111 functions to generate a validity bit value in accordance with each cycle of the clock signal generated by the clock circuit 113. During each cycle of the clock signal, the currently generated validity bit value is assigned to a validity bit associated with the output data being currently transmitted from the data buffer 105 to the pipelined logic 107. The validity bit and assigned validity bit value is transmitted along with the output data through each logic stage of the pipelined logic 107, in accordance with the clock signal, until ultimately being transmitted to the phy 109. For example, if a 32 bit output data signal is transmitted from the data buffer 105, a 33rd bit will also be defined as the validity bit. Each of the 33 bits representing the data signal and the validity bit will be transmitted together through the pipelined logic 107 to the phy 109, in accordance with the clock signal. The validity bit value generated by the data rate control module 111 provides a status indication of the associated output data. The status indication provided by the validity bit value signifies that the associated output data is either valid or invalid.

Upon receipt of the output data and corresponding validity bit at the phy 109, the phy 109 is defined to recognize the validity bit value as being either valid or invalid. If the validity bit value indicates valid, the output data is processed normally through the phy 109. If the validity bit value indicates invalid, the output data is discarded (i.e., ignored) by the phy 109. Thus, the rate at which output data is transmitted from the phy 109 is dependent upon the rate at which the valid bit value indicates a presence of valid output data. For example, if it were desired to transmit the output data from the phy 109 at a rate corresponding to the clock signal frequency, each validity bit arriving at the phy 109 will indicate that the associated output data is valid. Thus, the output data will be transmitted from the phy 109 in accordance with each cycle of the clock signal. In another example, if it were desired to transmit the output data from the phy 109 at a rate corresponding to one-third the clock signal frequency, every third validity bit arriving at the phy 109 will indicate that its associated output data is valid, while other validity bits arriving at the phy 109 will indicate that the associated output data is invalid. Thus, the output data will be transmitted from the phy 109 at a rate equal to one-third of the clock signal frequency.

In accordance with the foregoing, the data rate control module 111 is capable of controlling a data output rate (i.e., frequency) to be transmitted from the phy 109. The series of validity bit values generated by the data rate control module 111 in accordance with each cycle of the clock signal effectively represents a validity bit value pattern associated with a particular data output frequency. In one embodiment, the output data associated with a validity bit value indicating an invalid status will correspond to a repetition of previously transmitted output data. In another embodiment, a memory address counter for selecting output data to be transmitted from the data buffer 105 is configured to be incremented when the data rate control module 111 provides a validity bit value indicating a valid output data status. Thus, non-incrementing of the memory address counter between occurrences of a valid setting of the validity bit value will cause output data previously transmitted from the data buffer 105 to be retransmitted.

In one embodiment, the data rate control module 111 is capable of receiving an external input identifying a desired data output rate. Having knowledge of the clock signal frequency, the data rate control module 11 is capable of determining an appropriate clock cycle interval at which the validity bit should be set to indicate a valid status in order to achieve the desired data output rate. In another embodiment, the data rate control module 111 is capable of receiving an external input that directly specifies an appropriate clock cycle interval at which the validity bit should be set to indicate a valid status in order to achieve the desired data output rate.

In an exemplary embodiment of the present invention, both an ASIC and an FPGA prototype of the ASIC are designed with pipelined logic and a data rate control module. The pipelined logic is disposed between a data buffer and a phy as previously discussed. Also, the data rate control module is configured to generate a pattern of validity bit values to be assigned to validity bits accompanying output data transmitted from the data buffer through the pipelined logic to the phy, in accordance with a clock signal. Since the ASIC and the FPGA prototype are defined to have the same logic, test results obtained from the FPGA prototype should be applicable to the ASIC as long as the data output rate is approximately equal between the ASIC and the FPGA prototype.

Consider that the FPGA prototype in the present example is capable of operating at a maximum clock frequency of 25 MHz. Also, consider that the maximum data output rate of the FPGA prototype operating at 25 MHz is 1 gigabit/second. Therefore, if the data rate control module is operated to generate and assign a valid setting to the validity bit on each clock cycle, the output data reaching the phy on each clock cycle will be treated as valid and processed accordingly. In contrast to the FPGA prototype, the ASIC is capable of operating at a maximum clock frequency of 100 MHz. Thus, to achieve a data output rate from the ASIC of 1 gigabit/second in order to match the FPGA prototype, the data rate control module of the ASIC is operated to generate and assign a valid setting to the validity bit on every fourth clock cycle and an invalid setting to the validity bit on other clock cycles. Also, the ASIC can be configured to transmit successive output data from the data buffer in accordance with the valid setting of the validity bit (i.e., every fourth clock cycle). Therefore, as demonstrated by the present example, the method and corresponding apparatus of the present invention is capable of maintaining equivalent logic between an ASIC and a corresponding FPGA prototype while achieving an equivalent data output rate from each of the ASIC and the FPGA prototype. Also, it should be appreciated that the data rate control method and apparatus of the present invention can be implemented with any serial technology wherein a common data output rate needs to be obtained from two or more devices having substantially similar logic but different clock frequencies.

Figure 2:
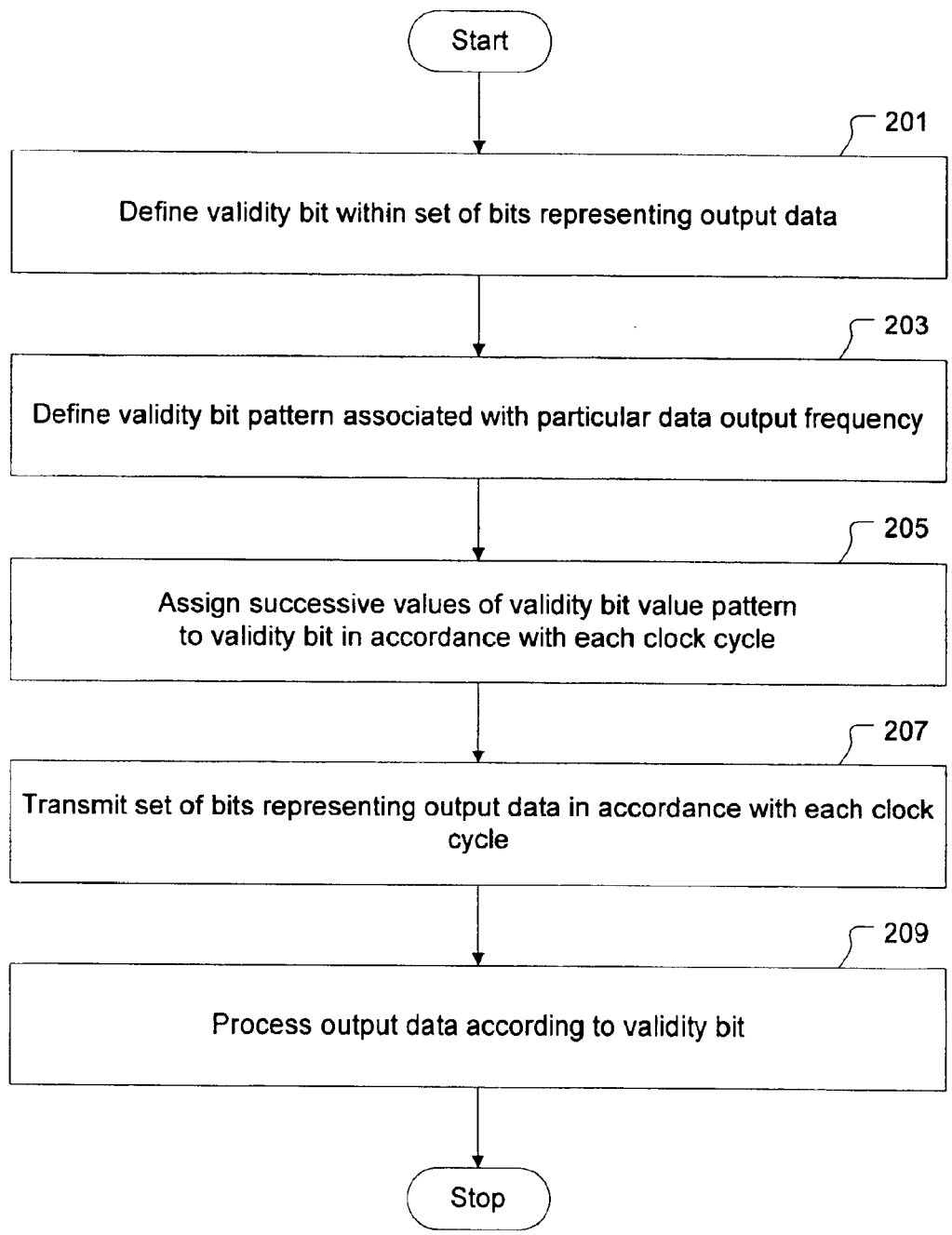
FIG. 2 is an illustration showing a flowchart of a method for controlling a data output frequency, in accordance with one embodiment of the present invention.

FIG. 2 is an illustration showing a flowchart of a method for controlling a data output frequency, in accordance with one embodiment of the present invention. It should be appreciated that the method of FIG. 2 is suitable for implementation in essentially any electronic device configured to provide output data at a particular rate. The method includes an operation 201 in which a validity bit is defined within a set of bits representing output data. For example, in one embodiment, the set of bits representing output data corresponds to a set of 33 bits, including 32 bits of data and one validity bit. The validity bit is provided to indicate whether the associated output data has a status of valid or invalid. The method continues with an operation 203 for defining a validity bit pattern associated with a particular data output frequency. The validity bit pattern represents a sequence of validity bit values. The validity bit pattern is defined such that validity bit values indicating valid output data occur within the sequence of validity bit values at a frequency corresponding to a desired data output rate.

The method also includes an operation 205 for assigning successive validity bit values of the validity bit pattern to the validity bit in accordance with each cycle of a clock signal. The method further includes an operation 207 for transmitting the set of bits representing output data in accordance with each cycle of the clock signal. In an operation 209, the transmitted output data is processed according to the value of the validity bit. For example, if the valid bit value indicates that the associated output data is valid, the associated output data will be handled in a normal manner. If the valid bit indicates that the associated output data is invalid, the associated output data (i.e., the invalid output data) will be discarded or ignored.

Figure 3:
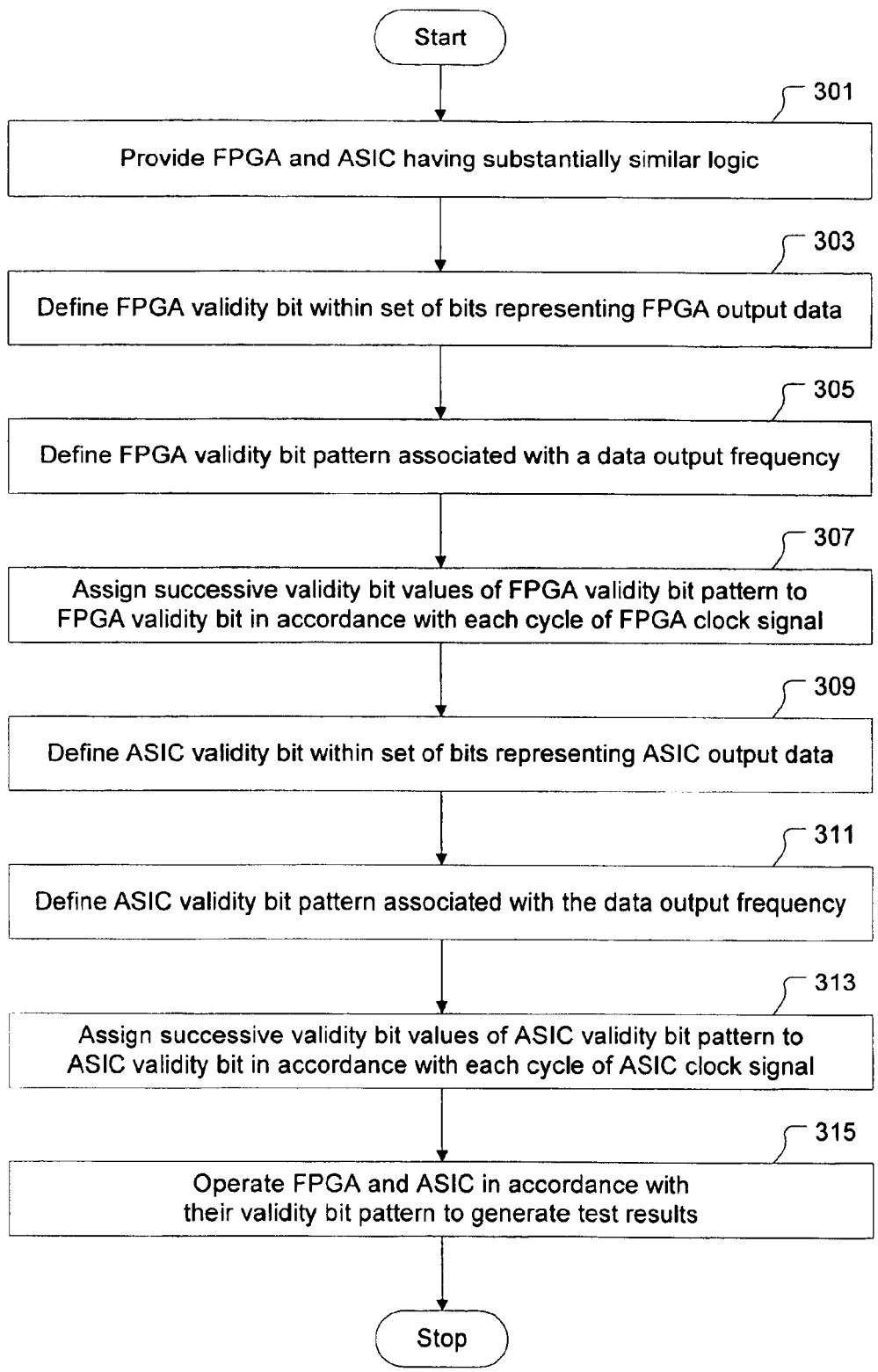
FIG. 3 is an illustration showing a flowchart of a method for testing circuitry, in accordance with one embodiment of the present invention.

FIG. 3 is an illustration showing a flowchart of a method for testing circuitry, in accordance with one embodiment of the present invention. The method includes an operation 301 for providing an FPGA and an ASIC having substantially similar logic. In an operation 303, an FPGA validity bit is defined within a set of bits representing FPGA output data. In an operation 305, an FPGA validity bit pattern is defined to generate a data output frequency. The data output frequency corresponds to a frequency of occurrence of an FPGA validity bit value indicating a valid status of the FPGA output data. In an operation 307, successive validity bit values of the FPGA validity bit pattern are assigned to the FPGA validity bit in accordance with each cycle of an FPGA clock signal.

The method continues with an operation 309 in which an ASIC validity bit is defined within a set of bits representing ASIC output data. In an operation 311, an ASIC validity bit pattern is defined to generate the same data output frequency as the FPGA. The data output frequency corresponds to a frequency of occurrence of an ASIC validity bit value indicating a valid status of the ASIC output data. In an operation 313, successive validity bit values of the ASIC validity bit pattern are assigned to the ASIC validity bit in accordance with each cycle of an ASIC clock signal, wherein the ASIC clock signal has a different frequency than the FPGA clock signal.

The method further includes an operation 315 in which the FPGA and the ASIC are operated in accordance with their respective validity bit pattern to each generate output data at the common data output frequency. In one embodiment, the output data from the FPGA and ASIC can be evaluated to determine whether the ASIC fabrication process was successful.

With the above embodiments in mind, it should be understood that the present invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for controlling a data output frequency, comprising:

defining a validity bit within a set of bits representing output data, the validity bit indicating a status of the output data;

defining a validity bit value pattern associated with a particular data output frequency;

assigning successive validity bit values of the validity bit value pattern to the validity bit in accordance with each cycle of a clock signal;

transmitting the set of bits representing output data in accordance with each cycle of the clock signal; and processing the output data according to the validity bit.

2. A method for controlling a data output frequency as recited in claim 1, wherein the validity bit indicates the status of the output data as being one of valid and invalid.

3. A method for controlling a data output frequency as recited in claim 2, wherein the validity bit indicating the status of the output data as being valid causes the output data to be processed normally.

4. A method for controlling a data output frequency as recited in claim 2, wherein the validity bit indicating the status of the output data as being invalid causes the output data to not be processed.

5. A method for controlling a data output frequency as recited in claim 1, wherein the validity bit value pattern represents a sequence of validity bit values, the sequence of validity bit values including valid values indicating the status of the output data as being valid, the valid values occurring within the sequence of validity bit values at a frequency corresponding to the particular data output frequency.

6. A method for controlling a data output frequency as recited in claim 1, wherein the clock signal is defined to maintain a substantially constant clock signal frequency, the clock signal frequency being an integer multiple of the particular data output frequency.

7. A method for controlling a data output frequency as recited in claim 1, further comprising:
   transmitting the set of bits representing output data in accordance with each cycle of the clock signal through pipelined logic defined by a plurality of sequentially configured logic stages; and
   operating each of the plurality of sequentially configured logic stages to manipulate the set of bits representing output data, whereby the validity bit within a set of bits representing output data remains unchanged.

8. A method for testing circuitry, comprising:
   providing a field programmable gate array (FPGA) and an application specific integrated circuit (ASIC), wherein the FPGA and ASIC have substantially similar logic;
   defining an FPGA validity bit pattern associated with a data output frequency;
   defining an ASIC validity bit pattern associated with the data output frequency; and
   operating the FPGA and the ASIC in accordance with their respective validity bit pattern to generate test results.

9. A method for testing circuitry as recited in claim 8, further comprising:
   defining an FPGA validity bit within a set of bits representing FPGA output data, the FPGA validity bit indicating a status of the FPGA output data as being one of valid and invalid; and
   defining an ASIC validity bit within a set of bits representing ASIC output data, the ASIC validity bit indicating a status of the ASIC output data as being one of valid and invalid.

10. A method for testing circuitry as recited in claim 9, further comprising:
    assigning successive validity bit values of the FPGA validity bit pattern to the FPGA validity bit in accordance with each cycle of an FPGA clock signal; and
    assigning successive validity bit values of the ASIC validity bit pattern to the ASIC validity bit in accordance with each cycle of an ASIC clock signal.

11. A method for testing circuitry as recited in claim 10, wherein the FPGA clock signal and the ASIC clock signal have different frequencies with respect to each other.

12. A method for testing circuitry as recited in claim 10, wherein operating the FPGA and the ASIC in accordance with their respective validity bit pattern includes,
    receiving the set of bits representing FPGA output data in accordance with each cycle of the FPGA clock signal,
    recognizing the FPGA validity bit as indicating the status of the FPGA output data to be valid and processing the FPGA output data,
    recognizing the FPGA validity bit as indicating the status of the FPGA output data to be invalid and discarding the FPGA output data,
    receiving the set of bits representing ASIC output data in accordance with each cycle of the ASIC clock signal,
    recognizing the ASIC validity bit as indicating the status of the ASIC output data to be valid and processing the ASIC output data, and
    recognizing the ASIC validity bit as indicating the status of the ASIC output data to be invalid and discarding the ASIC output data.

13. A method for testing circuitry as recited in claim 10, wherein a frequency of occurrence of an FPGA validity bit value indicating a valid status of the FPGA output data corresponds to the data output frequency, and
    wherein a frequency of occurrence of an ASIC validity bit value indicating a valid status of the ASIC output data corresponds to the data output frequency.

14. A method for testing circuitry as recited in claim 9, further comprising:
    transmitting the set of bits representing FPGA output data in accordance with each cycle of the FPGA clock signal through pipelined logic defined by a plurality of sequentially configured logic stages; and
    operating each of the plurality of sequentially configured logic stages to manipulate the set of bits representing FPGA output data, whereby the FPGA validity bit within a set of bits representing FPGA output data remains unchanged.

15. A method for testing circuitry as recited in claim 9, further comprising:
    transmitting the set of bits representing ASIC output data in accordance with each cycle of the ASIC clock signal through pipelined logic defined by a plurality of sequentially configured logic stages; and
    operating each of the plurality of sequentially configured logic stages to manipulate the set of bits representing ASIC output data, whereby the ASIC validity bit within a set of bits representing ASIC output data remains unchanged.

16. A data output frequency control module, comprising:
    a data rate control module configured to output a validity bit signal in accordance with a clock signal to be generated by a clock circuit;
    a logic stage configured to receive a data signal and the validity bit signal; and
    a transceiver connected to receive the data signal and the validity bit signal from the logic stage, the transceiver configured to recognize a valid state of the validity bit signal, the transceiver defined to process the data signal in response to the valid state.

17. A data output frequency control module as recited in claim 16, wherein the transceiver is further configured to recognize an invalid state of the validity bit signal, the transceiver defined to discard the data signal in response to the invalid state.

18. A data output frequency control module as recited in claim 16, wherein the data rate control module is further configured to generate a validity bit pattern representing a sequence of validity bit signals, the validity bit pattern being defined to cause the transceiver to process the data signal at a rate corresponding to a data output frequency.

19. A data output frequency control module as recited in claim 16, wherein the logic stage is connected to receive the data signal from a data buffer.

20. A data output frequency control module as recited in claim 16, wherein the logic stage is included within pipelined logic defined by a plurality of sequentially connected logic stages, wherein each of the plurality of sequentially connected logic stages is configured to manipulate the data signal without affecting the validity bit signal.

* * * * *